(12) United States Patent
Hori et al.

(10) Patent No.: US 7,999,438 B2
(45) Date of Patent: Aug. 16, 2011

(54) PIEZOELECTRIC-DRIVE APPARATUS, METHOD OF CONTROLLING PIEZOELECTRIC-DRIVE AND ELECTRONIC DEVICE

(75) Inventors: Hisao Hori, Miyagi (JP); Takashi Watanabe, Miyagi (JP)

(73) Assignee: Advantest Corporation, Tokyo (JP)

( * ) Notice: Subject to any disclaimer, the term of this patent is extended or adjusted under 35 U.S.C. 154(b) by 313 days.

(21) Appl. No.: 12/345,681

(22) Filed: Dec. 30, 2008

(65) Prior Publication Data

US 2010/0007242 A1   Jan. 14, 2010

(30) Foreign Application Priority Data

Jan. 16, 2008   (JP) .................. 2008-007449

(51) Int. Cl.
*H01L 41/09* (2006.01)
(52) U.S. Cl. ...................... 310/317; 310/338
(58) Field of Classification Search .............. 310/317, 310/330–332, 338
See application file for complete search history.

(56) References Cited

U.S. PATENT DOCUMENTS

| | | | | |
|---|---|---|---|---|
| 4,675,960 A | * | 6/1987 | Higgins, Jr. .................. 29/25.35 |
| 4,689,514 A | * | 8/1987 | Kondoh et al. .......... 310/323.21 |
| 2004/0017129 A1 | * | 1/2004 | Hooley et al. ................. 310/311 |
| 2007/0080608 A1 | * | 4/2007 | Maruyama et al. ........... 310/317 |
| 2010/0281962 A1 | * | 11/2010 | Shih et al. .......................... 73/78 |

FOREIGN PATENT DOCUMENTS

| | | |
|---|---|---|
| JP | 53-045510 | 4/1978 |
| JP | 60-259347 | 12/1985 |
| JP | 01-093184 | 4/1989 |
| JP | 04-370986 | 12/1992 |
| JP | 10-239173 | 9/1998 |
| JP | 2001-156352 | 6/2001 |
| JP | 2005-308687 | 11/2005 |
| JP | 2007-324336 | 12/2007 |

OTHER PUBLICATIONS

"Office Action of Japan Counterpart Application", issued on Nov. 30, 2010, p. 1, in which the listed references were cited.

\* cited by examiner

*Primary Examiner* — Derek Rosenau
(74) *Attorney, Agent, or Firm* — Jianq Chyun IP Office

(57) ABSTRACT

A piezoelectric driving device including a laminated body having a base that is capable of being deformed by applying force, a first piezoelectric body that is formed on a first face of the base directly or via another layer, and a second piezoelectric body that is formed on a second face of the base substantially parallel to the first face directly or via another layer, a driving voltage generating section that generates a driving voltage according to a displacement amount of the laminated body, a compensating voltage generating section that generates a compensating voltage compensating for hysteresis caused by the displacement of the laminated body by the driving voltage, and a voltage applying section that applies each of the driving voltage and the compensating voltage to each of the first piezoelectric body and the second piezoelectric body.

24 Claims, 9 Drawing Sheets

PIEZOELECTRIC-DRIVE APPARATUS, METHOD OF CONTROLLING PIEZOELECTRIC-DRIVE AND ELECTRONIC DEVICE

CROSS REFERENCE TO RELATED APPLICATION

This patent application claims priority from a Japanese patent application No. 2008-007449 filed on Jan. 16, 2008, the contents of which are incorporated herein by reference.

BACKGROUND

1. Technical Field

The present invention relates to a piezoelectric driving device, a piezoelectric drive controlling method, and an electronic device. More particularly, the present invention relates to a piezoelectric driving device, a piezoelectric drive controlling method, and an electronic device which can reduce the hysteresis of a laminated piezoelectric body obtained by laminating a plurality of piezoelectric bodies.

2. Related Art

There has conventionally been known a bimorph actuator made by superimposing two piezoelectric plates on each other. For example, Japanese Patent Application Publication No. 2001-156352 discloses a bimorph actuator that is made by superimposing first and second piezoelectric plates on each other and then joining them together. In the bimorph actuator, a voltage is applied between the first and second piezoelectric plates and thus the actuator is expanded and contracted in different directions along longitudinal directions of both piezoelectric plates. At this time, one piezoelectric plate is used as a means for driving the actuator and the other piezoelectric plate is used as a sensor for correcting hysteresis. The output of the sensor is used for the feedback control of the voltage that is applied to the piezoelectric plate for driving the actuator.

A piezoelectric actuator has hysteresis between an applied voltage and a displacement amount in accordance with increase and decrease directions of the applied voltage. There is a problem that the hysteresis degrades the linearity characteristic of the piezoelectric actuator and thus the displacement amount cannot be controlled with high precision using the piezoelectric actuator.

Since the bimorph actuator according to Japanese Patent Application Publication No. 2001-156352 does not apply a voltage to the piezoelectric plate used as a sensor, the displacement amount cannot be controlled if a feedback control is not performed. In addition, since the displacement amount of the actuator is controlled with one piezoelectric plate, it is difficult to improve linearity. Therefore, there is a need to provide a piezoelectric driving device and a piezoelectric drive controlling method for controlling the displacement amount of a piezoelectric actuator with good linearity, and an electronic device using the device and method.

SUMMARY

Therefore, it is an object of an aspect of innovation included in the present specification to provide a piezoelectric driving device, a piezoelectric drive controlling method, and an electronic device that can solve the foregoing problems. The above and other objects can be achieved by combinations described in the independent claims. The dependent claims define further advantageous and exemplary combinations of the present invention.

That is, according to the first aspect related to the innovations herein, one exemplary piezoelectric driving device may include: a laminated body having a base that is capable of being deformed by applying force, a first piezoelectric body that is formed on a first face of the base directly or via another layer, and a second piezoelectric body that is formed on a second face of the base substantially parallel to the first face directly or via another layer; a driving voltage generating section that generates a driving voltage according to a displacement amount of the laminated body; a compensating voltage generating section that generates a compensating voltage compensating for hysteresis caused by the displacement of the laminated body by the driving voltage; and a voltage applying section that applies each of the driving voltage and the compensating voltage to each of the first piezoelectric body and the second piezoelectric body.

Moreover, according to the second aspect related to the innovations herein, one exemplary piezoelectric drive controlling method may include: preparing a laminated body having a base that is capable of being deformed by applying force, a first piezoelectric body that is formed on a first face of the base directly or via another layer, and a second piezoelectric body that is formed on a second face of the base substantially parallel to the first face directly or via another layer; generating a driving voltage according to a displacement amount of the laminated body; generating a compensating voltage compensating for hysteresis caused by displacement of the laminated body by the driving voltage; and applying each of the driving voltage and the compensating voltage to each of the first piezoelectric body and the second piezoelectric body.

Moreover, according to the third aspect related to the innovations herein, one exemplary electronic device may include: a piezoelectric driving device including a laminated body having a base that is capable of being deformed by applying force, a first piezoelectric body that is formed on a first face of the base directly or via another layer, and a second piezoelectric body that is formed on a second face of the base substantially parallel to the first face directly or via another layer, a driving voltage generating section that generates a driving voltage according to a displacement amount of the laminated body, a compensating voltage generating section that generates a compensating voltage compensating for hysteresis caused by displacement of the laminated body by the driving voltage, and a voltage applying section that applies each of the driving voltage and the compensating voltage to each of the first piezoelectric body and the second piezoelectric body; a displacement electrode that is disposed on a displacement section of the piezoelectric driving device; and a fixed electrode that forms a variable capacity along with the displacement electrode.

The summary does not necessarily describe all necessary features of the present invention. The present invention may also be a sub-combination of the features described above.

DESCRIPTION OF EXEMPLARY EMBODIMENTS

The embodiments of the invention will now be described based on the preferred embodiments, which do not intend to limit the scope of the present invention, but just exemplify the invention. All of the features and the combinations thereof described in the embodiment are not necessarily essential to the invention.

Figure 1:
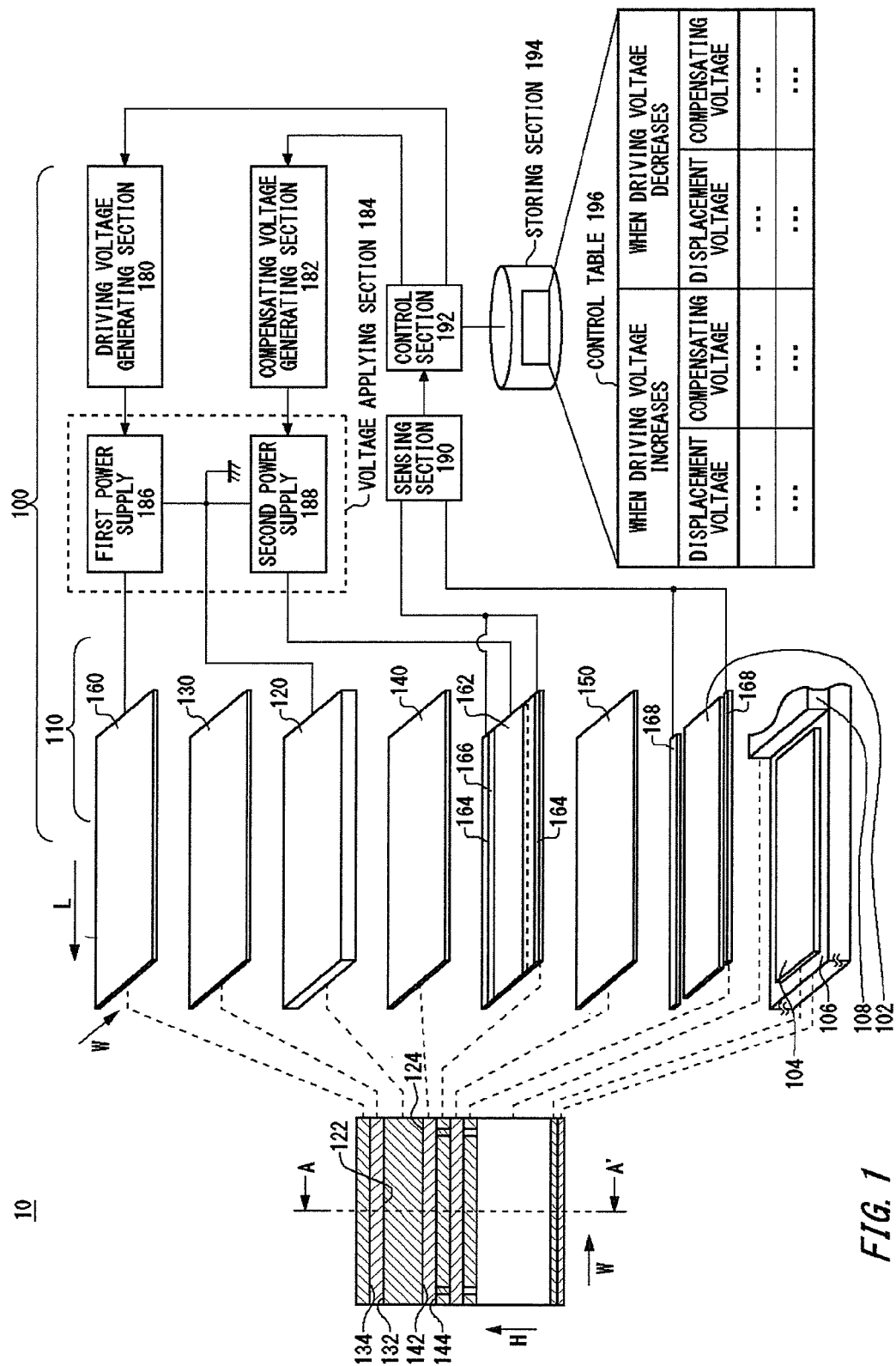
FIG. 1 is a functional block diagram schematically showing a variable capacitor 10 including a piezoelectric driving device 100 and a circuit for driving the piezoelectric driving device 100 according to the present embodiment.

FIG. 1 is a functional block diagram schematically showing a variable capacitor 10 including a piezoelectric driving device 100 and a circuit for driving the piezoelectric driving device 100 according to the present embodiment. The piezoelectric driving device 100 in the present drawing is shown as an exploded perspective view. The left side of the exploded perspective view shows a sectional view obtained by cutting the piezoelectric driving device 100 in a width direction W in the neighborhood of the center of the device in a longitudinal direction L.

The variable capacitor 10 may be an example of an electronic device. The variable capacitor 10 includes the piezoelectric driving device 100, a displacement electrode 102, a fixed electrode 104, a substrate 106, and a pedestal 108.

The piezoelectric driving device 100 controls the distance between the displacement electrode 102 and the fixed electrode 104. The piezoelectric driving device 100 includes a laminated body 110, a driving voltage generating section 180, a compensating voltage generating section 182, a voltage applying section 184, a sensing section 190, a control section 192, a storing section 194, and a control table 196.

The laminated body 110 is displaced in a height direction H (a lamination direction) by applying a voltage. The laminated body 110 includes a base 120, a first piezoelectric body 130, a second piezoelectric body 140, and a third piezoelectric body 150. The laminated body 110 further includes a first electrode 160, a second electrode 162, a first sensing electrode 164, an insulating layer 166, and a second sensing electrode 168.

The base 120 has elasticity. In this way, since the base 120 can be deformed by applying force, the base 120 is bent when the first piezoelectric body 130 or the second piezoelectric body 140 is expanded and contracted and thus the base 120 is applied with the force. The base 120 has stiffness. In this way, the base 120 restrains the laminated body 110 from being bent too much. For example, the base 120 may be formed using an electric conductor such as aluminum, gold, or platinum, an insulating material such as glass, or a semiconductor such as silicon.

As an example, the base 120 may use platinum having a flat plate shape of a size of 90 μm (a width direction W), 750 μm (a length direction L), and 0.5 μm (a height direction H). An electric conductor can be used for the base 120 to utilize the base 120 as an electrode that applies a voltage to the first piezoelectric body 130 and the second piezoelectric body 140.

The first piezoelectric body 130 is formed on a first face 122 of the base 120. When a voltage is applied to the first piezoelectric body 130, the first piezoelectric body 130 is distorted and thus contracted and expanded. When the voltage is applied, the first piezoelectric body 130 is arranged to be expanded and contracted in the longitudinal direction L and thus cause the laminated body 110 to be bent in the height direction H.

The first piezoelectric body 130 may use a wurtzite-type crystal such as aluminum nitride (AlN) and zinc oxide (ZnO), a perovskite-system ferroelectric material such as lead zirconium titanate (PZT), lead lanthanum zirconate titanate (PLZT), or barium titanate (BTO), and so on. As an example, the first piezoelectric body 130 may use a piezoelectric film of PZT having a size of 90 μm (the width direction W), 750 μm (the longitudinal direction L), and 0.5 μm (the height direction H).

The second piezoelectric body 140 is formed on a second face 124 of the base 120 substantially parallel to the first face 122. When a voltage is applied to the second piezoelectric body 140, the second piezoelectric body 140 is distorted and thus contracted and expanded. When the voltage is applied, the second piezoelectric body 140 is arranged to be expanded and contracted in the longitudinal direction L and thus cause the laminated body 110 to be bent in the height direction H. The second piezoelectric body 140 may be a piezoelectric body similar to the first piezoelectric body 130. As an example, the second piezoelectric body 140 may use a piezoelectric film of PZT having a size of 90 μm (the width direction W), 750 μm (the longitudinal direction L), and 0.5 μm (the height direction H).

The third piezoelectric body 150 is formed on a face 144 opposite to a face 142 of the second piezoelectric body 140 facing the base 120 via the second electrode 162, the first sensing electrode 164, and the insulating layer 166. When a voltage is applied to the third piezoelectric body 150, the third piezoelectric body 150 is distorted and thus contracted and expanded. When the voltage is applied, the third piezoelectric body 150 is arranged to be expanded and contracted in the longitudinal direction L and thus cause the laminated body 110 to be bent in the height direction H. The third piezoelectric body 150 may be a piezoelectric body similar to the first piezoelectric body 130. As an example, the third piezoelectric body 150 may use a piezoelectric film of PZT having a size of 90 μm (the width direction W), 750 μm (the longitudinal direction L), and 0.5 μm (the height direction H).

The first electrode 160 is formed on a face 134 opposite to a face 132 of the first piezoelectric body 130 facing the base 120. The first electrode 160 has a flat plate shape to be elongated in the longitudinal direction L of the laminated body 110. For example, the first electrode 160 may use metal that has low resistance and is easily processed, such as aluminum (Al), gold (Au), platinum (Pt), copper (Cu), indium (In), tungsten (W), molybdenum (Mo), ruthenium (Ru), and iridium (Ir), an oxide electrode such as ruthenium oxide ($RuO_2$) and iridium oxide ($IrO_2$), or a semiconductor such as silicon (Si). When a silicon substrate is used as the electrode material, it is preferred to use a highly-doped substrate. Platinum having a thickness of 0.2 μm in the height direction H may be used as an example of the first electrode 160.

The second electrode 162 is formed on the face 144 opposite to the face 142 of the second piezoelectric body 140 facing the base 120. The second electrode 162 has, for example, a flat plate shape to be elongated in the longitudinal direction L of the laminated body 110. The width of the second electrode 162 may be less than the width of the second piezoelectric body 140. The second electrode 162 may use an electrode material similar to that of the first electrode 160. As an example, the second electrode 162 may use platinum having a thickness of 0.2 μm in the height direction H.

For example, the first sensing electrode 164 is formed on the face 144 on which the second electrode 162 is formed. The first sensing electrode 164 has, for example, a flat plate shape to be elongated in the longitudinal direction L of the laminated body 110. For example, the first sensing electrodes 164 are arranged at both ends of the second electrode 162 in the width direction W via the insulating layers 166. In this way, the first sensing electrodes 164 are electrically insulated from the second electrode 162. The first sensing electrodes 164 can be arranged at both ends of the second piezoelectric body 140 in the width direction W.

The first sensing electrode 164 may use an electrode material similar to that of the first electrode 160. The first sensing electrode 164 may have substantially the same thickness as the second electrode 162. As an example, the first sensing electrode 164 may use platinum having a thickness of 0.2 μm in the height direction H.

The insulating layer 166 is formed on the face 144 on which the second electrode 162 and the first sensing electrode 164 are formed. The insulating layer 166 has a flat plate shape to be elongated in the longitudinal direction L of the laminated body 110. The insulating layer 166 is arranged so as to be sandwiched between the second electrode 162 and the first sensing electrode 164. The insulating layer 166 electrically insulates the second electrode 162 from the first sensing electrode 164.

For example, the insulating layer 166 may use an insulating material such as silicon oxide ($SiO_2$). As an example, the insulating layer 166 may use $SiO_2$ having a thickness of 0.2 μm in the height direction H.

The second sensing electrode 168 is formed on a face opposite to a face of the third piezoelectric body 150 facing the second piezoelectric body 140. The second sensing electrode 168 is formed so that at least a part of the second sensing electrode 168 faces the first sensing electrode 164. The second sensing electrode 168 may have substantially the same shape as the first sensing electrode 164. The second sensing electrode 168 may be arranged at a position facing the first sensing electrode 164 via the third piezoelectric body 150. In this way, a displacement voltage in the third piezoelectric body 150 generated by the displacement of the laminated body 110 can be sensed with high precision.

For example, the laminated body 110 can be formed using a fine processing technology such as a sol-gel process, a sputtering, a CVD, or an etching. The method for forming the laminated body 110 is not limited to the fine processing technology, and for example, the laminated body 110 may be formed by adhesion.

In addition, the first piezoelectric body 130 and the second piezoelectric body 140 in the present embodiment are directly formed on the first face 122 or the second face 124 of the base 120, but may be formed via another layer. For example, the other layer may be a conductive electrode. The third piezoelectric body 150 is formed on the second face 124 of the base 120 via the second piezoelectric body 140, but may be directly formed on the second face 124 of the base 120 to laminate them in order of the base 120, the third piezoelectric body 150, and the second piezoelectric body 140.

In the present embodiment, the second electrode 162 and the first sensing electrode 164 are electrically insulated from each other by being spaced from each other in the width direction W of the laminated body 110, but the method for insulating the second electrode 162 from the first sensing electrode 164 is not limited to this. For example, the second electrode 162 may have a thin area having a thickness in the height direction H, and the first sensing electrode 164 and the insulating layer 166 may be arranged in this area so as to insulate the second electrode 162 from the first sensing electrode 164 by means of the insulating layer 166.

The driving voltage generating section 180 generates a driving voltage according to the displacement amount of the laminated body 110. The driving voltage generating section 180 receives a signal related to the driving voltage from the control section 192. The driving voltage generating section 180 outputs to the voltage applying section 184 a signal indicating that the driving voltage should be applied to the first electrode 160.

The compensating voltage generating section 182 generates a compensating voltage compensating for hysteresis caused by the displacement of the laminated body 110 by the driving voltage. The compensating voltage generating section 182 receives a signal related to the compensating voltage from the control section 192. The compensating voltage generating section 182 outputs to the voltage applying section 184 a signal indicating that the compensating voltage should be applied to the second electrode 162.

The voltage applying section 184 applies each of the driving voltage and the compensating voltage to each of the first piezoelectric body 130 and the second piezoelectric body 140. The voltage applying section 184 includes a first power supply 186 and a second power supply 188.

For example, the output port of the first power supply 186 is connected to an end of the first electrode 160, which is fixed to the pedestal 108. For example, the ground port of the first power supply 186 is connected to an end of the base 120, which is fixed to the pedestal 108. In this way, when a voltage is applied to the first electrode 160, a potential difference occurs in the height direction H of the first piezoelectric body 130 and thus the first piezoelectric body 130 is displaced in the height direction H.

For example, the output port of the second power supply 188 is connected to an end of the second electrode 162, which is fixed to the pedestal 108. The ground port of the second power supply 188 is connected to an end of the base 120, which is fixed to the pedestal 108. In this way, when a voltage is applied to the second electrode 162, a potential difference occurs in the height direction H of the second piezoelectric body 140 and thus the second piezoelectric body 140 is displaced in the height direction H.

By the above configuration, the voltage applying section 184 can independently apply a voltage to each of the first piezoelectric body 130 and the second piezoelectric body 140. In addition, the compensating voltage generating section 182 may apply a modulation voltage to be superposed on the compensating voltage. In this way, the variable capacitor 10 can be used as an oscillation circuit. Moreover, when a modulating signal for the modulation voltage is superposed on a signal having a reference frequency, the variable capacitor 10 can be applied to an oscillator for a frequency modulated signal source, an AFC (Auto Frequency Control), or a PLL (Phase Locked Loop).

The sensing section 190 detects a displacement voltage generated in the third piezoelectric body 150 by the displacement of the laminated body 110. The sensing section 190 is connected to the first sensing electrode 164 and the second sensing electrode 168. In addition, the third piezoelectric body 150 can use as a material thereof a material having a large piezoelectric constant, for example, a single-crystal material or PZT. The material having a large piezoelectric constant can be used to increase the sensitivity of sensing.

The sensing section 190 receives signals related to electric potentials from the first sensing electrode 164 and the second sensing electrode 168. The sensing section 190 detects the potential difference between electric potentials as a displacement voltage generated in the third piezoelectric body 150. The sensing section 190 outputs a signal related to the displacement voltage to the control section 192. In addition, the piezoelectric driving device 100 may have an amplifying section between the sensing section 190 and the control section 192, amplify the displacement voltage detected in the sensing section 190 therein, and then output the amplified voltage to the control section 192.

The control section 192 controls the driving voltage generating section 180 and the compensating voltage generating section 182. The control section 192 sets the displacement amount of the laminated body 110. The control section 192 outputs a signal related to a driving voltage according to this displacement amount to the driving voltage generating section 180.

The control section 192 receives a signal related to the displacement voltage from sensing section 190. The control section 192 obtains a compensating voltage according to the displacement voltage on the basis of the signal related to this displacement voltage, the signal related to the increase and decrease of the driving voltage, and the control table 196 stored in the storing section 194. The control section 192 outputs the signal related to this compensating voltage to the compensating voltage generating section 182.

The functions of the control section 192, the driving voltage generating section 180, and the compensating voltage generating section 182 are not definitely distinguished. For example, the control section 192 may output to the voltage applying section 184 a signal indicating that the driving voltage or the compensating voltage should be applied. Similarly, the driving voltage generating section 180 may obtain the driving voltage according to the displacement amount of the laminated body 110, and the compensating voltage generating section 182 may obtain a compensating voltage according to a displacement voltage.

The storing section 194 stores the control table 196. The control table 196 previously defines a relation between a displacement voltage and a compensating voltage. The control table 196 defines a displacement voltage and a compensating voltage corresponding to this displacement voltage on the basis of a measurement value obtained by previously measuring the displacement voltage for the driving voltage, for each of the case that the driving voltage is increased and the case that the driving voltage is decreased.

Specifically, for each of the case that the driving voltage to be applied to the laminated body 110 is being increased from the minimum voltage to the maximum voltage and the case that the driving voltage is being decreased from the maximum voltage to the minimum voltage, the sensing section 190 detects a displacement voltage when a predetermined driving voltage is applied to the first electrode 160. After that, for example, while the displacement amount of the laminated body 110 is observed with a CCD camera, a compensating voltage is applied to the second electrode 162 so that the displacement amount of the laminated body 110 becomes linear for the driving voltage. When the value of the compensating voltage at which the displacement amount becomes linear for the driving voltage is obtained, the information showing the increase or decrease of the driving voltage, the driving voltage, the displacement voltage corresponding to this driving voltage, and the compensating voltage corresponding to this displacement voltage are recorded in the control table 196 to be stored in the storing section 194.

In this way, since the relation between the displacement voltage and the compensating voltage is defined on the basis of the measurement value previously measured for each of the case that the driving voltage is increased and the case that the driving voltage is decreased, the displacement amount of the laminated body 110 can be controlled without using a complicated feedback circuit. Since this relation is previously defined, the displacement amount of the laminated body 110 can be quickly controlled. Furthermore, after the voltage range between the minimum voltage and the maximum voltage is divided into a plurality of ranges, a control table 196 may be created for each range, and thus the displacement amount can be controlled with higher precision.

The displacement electrode 102 is disposed in the laminated body 110 of the piezoelectric driving device 100. The displacement electrode 102 may be disposed on the face opposite to the face of the third piezoelectric body 150 facing the second piezoelectric body 140. Since the second sensing electrodes 168 are disposed in the neighborhood of both ends on this face, the displacement electrode 102 is disposed separately from the second sensing electrodes 168. In this way, the displacement electrode 102 and the second sensing electrodes 168 are electrically insulated from each other.

The displacement electrode 102 may use an electrode material similar to that of the first electrode 160. As an example, the displacement electrode 102 may use platinum having a thickness of 0.2 μm in the height direction H.

A variable capacity is formed between the fixed electrode 104 and the displacement electrode 102. The fixed electrode 104 is disposed separately from the displacement electrode 102 so that at least a part of the fixed electrode 104 faces the displacement electrode 102. The fixed electrode 104 may be disposed separately from the displacement electrode 102 in the height direction H at a position facing the displacement electrode 102. The fixed electrode 104 may use an electrode material similar to that of the first electrode 160. As an example, the fixed electrode 104 may use platinum having a thickness of 0.2 μm in the height direction H.

The substrate 106 has a flat surface supporting the fixed electrode 104. For example, the substrate 106 may use an insulating glass substrate or a semiconductor substrate such as silicon. As an example, the substrate 106 may use a silicon substrate.

The pedestal 108 is disposed on the substrate 106 at a position separated from the fixed electrode 104 in the neighborhood of the fixed electrode 104. The pedestal 108 may use an insulating material such as silicon oxide ($SiO_2$). As an example, the pedestal 108 may use $SiO_2$.

The thickness of the pedestal 108 may be equal to or greater than the maximum displacement amount of the laminated body 110. In this case, the maximum displacement amount of the laminated body 110 means the displacement amount of the laminated body 110 when the maximum voltage that can be applied to the laminated body 110 is applied.

Figure 2:
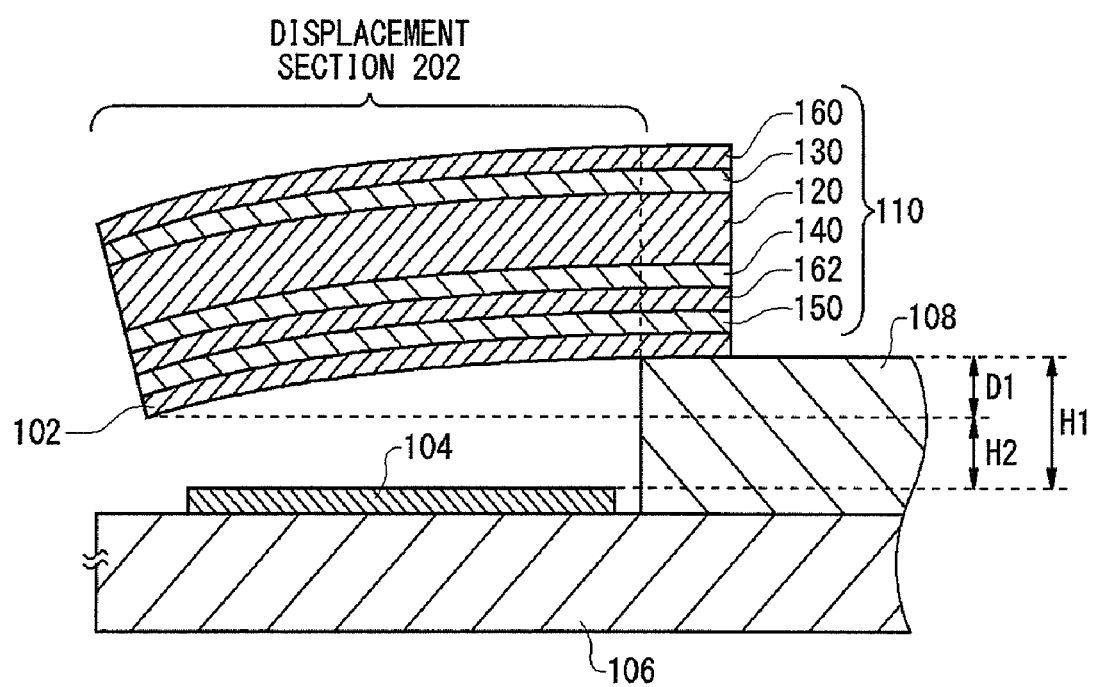
FIG. 2 is a sectional diagram schematically showing the variable capacitor 10 when the variable capacitor 10 is cut with an A-A' section.

FIG. 2 is a sectional diagram schematically showing the variable capacitor 10 when the variable capacitor 10 is cut with an A-A' section. As shown in FIG. 2, the laminated body 110 may be fixed on the substrate 106 via the pedestal 108. The pedestal 108 supports one end of the laminated body 110 in the longitudinal direction L. When a voltage is applied to the laminated body 110, a displacement section 202 that is not supported by the pedestal 108 in the laminated body 110 can be bent (the displacement section 202 is displaced downward in the present drawing) or bent backward (the displacement section 202 is displaced upward in the present drawing) in the height direction H.

The displacement electrode 102 is disposed at the side of the displacement section 202 in the laminated body 110, which faces the substrate 106. The fixed electrode 104 is disposed at a position facing the displacement electrode 102 in the substrate 106. Since the pedestal 108 has a thickness in the height direction H, the variable capacitor 10 has a distance H1 between the displacement electrode 102 and the fixed electrode 104 in a state that a voltage is not applied to the laminated body 110. In this way, a flat capacitor is formed between the displacement electrode 102 and the fixed electrode 104.

The displacement amount D1 of the displacement section 202 is changed in accordance with the voltage applied to the laminated body 110. When the displacement amount D1 is changed, a distance H2 between the displacement electrode 102 and the fixed electrode 104 is also changed when the voltage is applied to the laminated body 110. Since the capacity of the variable capacitor 10 is inversely proportional to the distance H2 between the displacement electrode 102 and the fixed electrode 104, the voltage applied to the laminated body 110 can be controlled to control the capacity of the variable capacitor 10. In this way, a variable capacity is formed between the displacement electrode 102 and the fixed electrode 104.

In addition, the variable capacitor 10 in the present embodiment has a so-called cantilever structure in which one end of the laminated body 110 is supported, but a structure supporting the laminated body 110 is not limited to this. For example, another structure may be a so-called simple beam structure in which both ends of the laminated body 110 in the longitudinal direction L are supported and the neighborhood of the center of the laminated body 110 in the longitudinal direction L is displaced in the height direction H. In another example of the simple beam structure, since a discoid laminated body 110 is prepared and the circumference of the laminated body 110 is supported, the neighborhood of the center of the laminated body 110 may be displaced in the height direction H.

Figure 3:
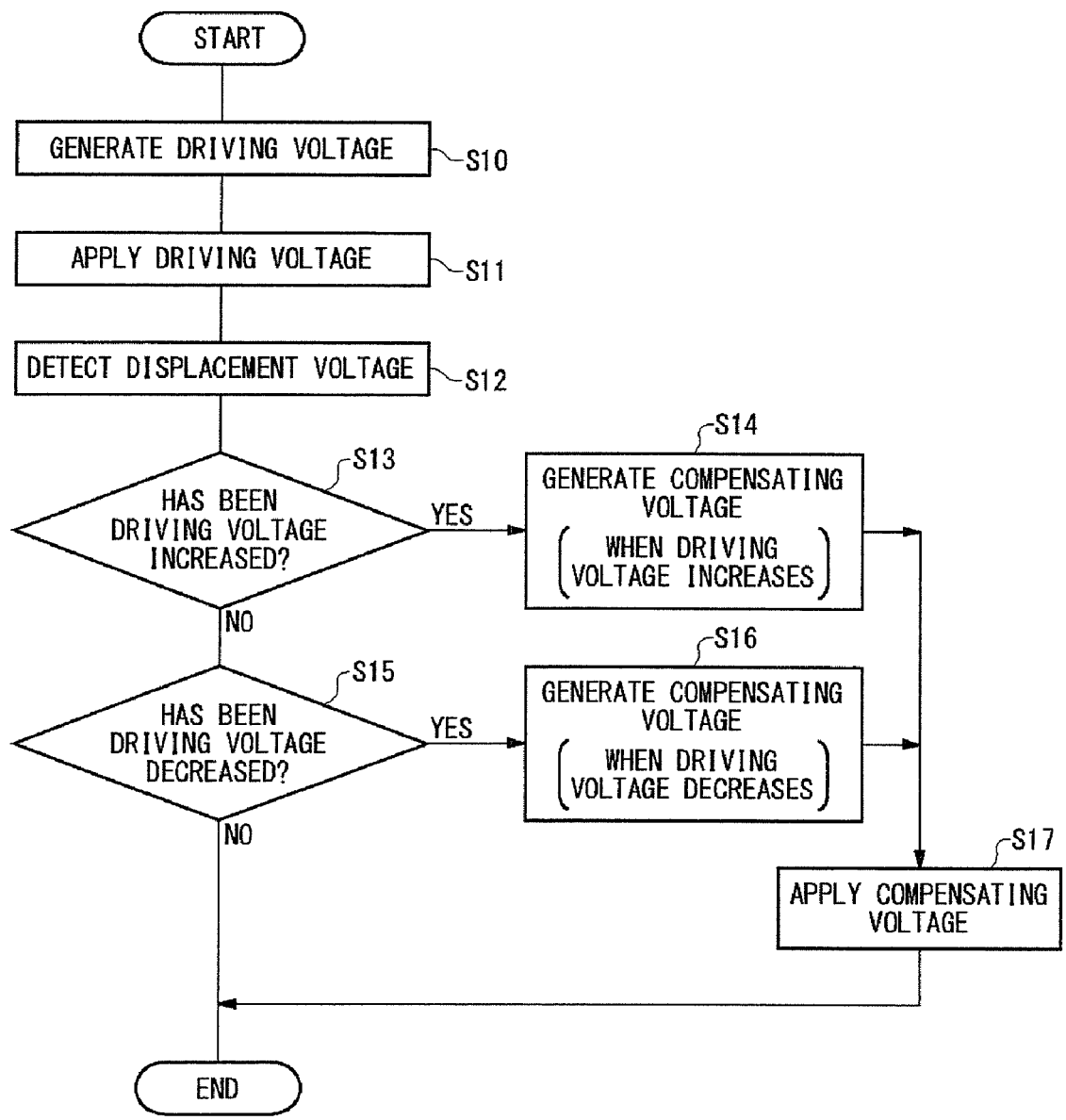
FIG. 3 is a flowchart exemplary showing a piezoelectric drive controlling method of the piezoelectric driving device 100.

FIG. 3 is a flowchart exemplary showing a piezoelectric drive controlling method of the piezoelectric driving device 100. Hereinafter, when the capacity of the variable capacitor 10 is adjusted to a predetermined capacity, the piezoelectric drive controlling method of the piezoelectric driving device 100 will be described.

First, the piezoelectric driving device 100 generates a driving voltage (S10). The driving voltage is generated as follows.

The control section 192 stores a driving voltage that is now being applied to the first electrode 160. The control section 192 obtains the driving voltage to be applied to the first electrode 160 from the displacement amount of the laminated body 110, by which the capacity of the variable capacitor 10 after the adjustment is formed. The control section 192 outputs a signal related to this driving voltage to the driving voltage generating section 180. The driving voltage generating section 180 outputs to the voltage applying section 184 a signal indicating that the driving voltage inputted from the control section 192 should be applied to the first electrode 160.

Next, the piezoelectric driving device 100 applies the driving voltage (S11). The voltage applying section 184 applies a voltage generated from the first power supply 186 to the first electrode 160 in order to apply the driving voltage.

Next, the piezoelectric driving device 100 detects a displacement voltage (S12). The displacement voltage is detected as follows.

When the voltage is applied to the first electrode 160, the first piezoelectric body 130 is distorted and thus contracted and expanded to cause the laminated body 110 to be displaced. The third piezoelectric body 150 is also displaced along with the laminated body 110. When the third piezoelectric body 150 is displaced, a displacement voltage according to the displacement amount of the third piezoelectric body 150 occurs between the first sensing electrode 164 and the second sensing electrode 168. The sensing section 190 detects this displacement voltage. The sensing section 190 outputs a signal related to this displacement voltage to the control section 192.

Next, the control section 192 decides whether or not the driving voltage has been increased in S11 (S13). When the driving voltage has been increased (S13:YES), a compensating voltage when the driving voltage is increased is generated (S14). The compensating voltage is generated as follows.

The control section 192 refers to the compensating voltage, which is defined in the control table 196 and corresponds to the displacement voltage when the driving voltage is increased. The control section 192 obtains a compensating voltage corresponding to the displacement voltage inputted from the sensing section 190. The control section 192 outputs a signal related to this compensating voltage to the compensating voltage generating section 182. The compensating voltage generating section 182 outputs to the voltage applying section 184 a signal indicating that the compensating voltage inputted from the control section 192 should be applied to the second electrode 162.

When the control section 192 decides in S13 that the driving voltage is not increased in S11 (S13: NO), the control section 192 decides whether or not the driving voltage has been decreased in S11 (S15). When the driving voltage has been decreased (S15:YES), a compensating voltage when the driving voltage is decreased is generated (S16). The compensating voltage is generated as follows.

The control section 192 refers to the compensating voltage, which is stored in the control table 196 and corresponds to the displacement voltage when the driving voltage is decreased. The control section 192 obtains a compensating voltage corresponding to the displacement voltage inputted from the sensing section 190. The control section 192 outputs a signal related to this compensating voltage to the compensating voltage generating section 182. The compensating voltage generating section 182 outputs to the voltage applying section 184 a signal indicating that the compensating voltage inputted from the control section 192 should be applied to the second electrode 162.

Next, the piezoelectric driving device 100 applies the compensating voltage generated in S14 or S16 (S17). The voltage applying section 184 applies a voltage generated from the second power supply 188 to the second electrode 162 in order to apply the compensating voltage.

Figure 4:
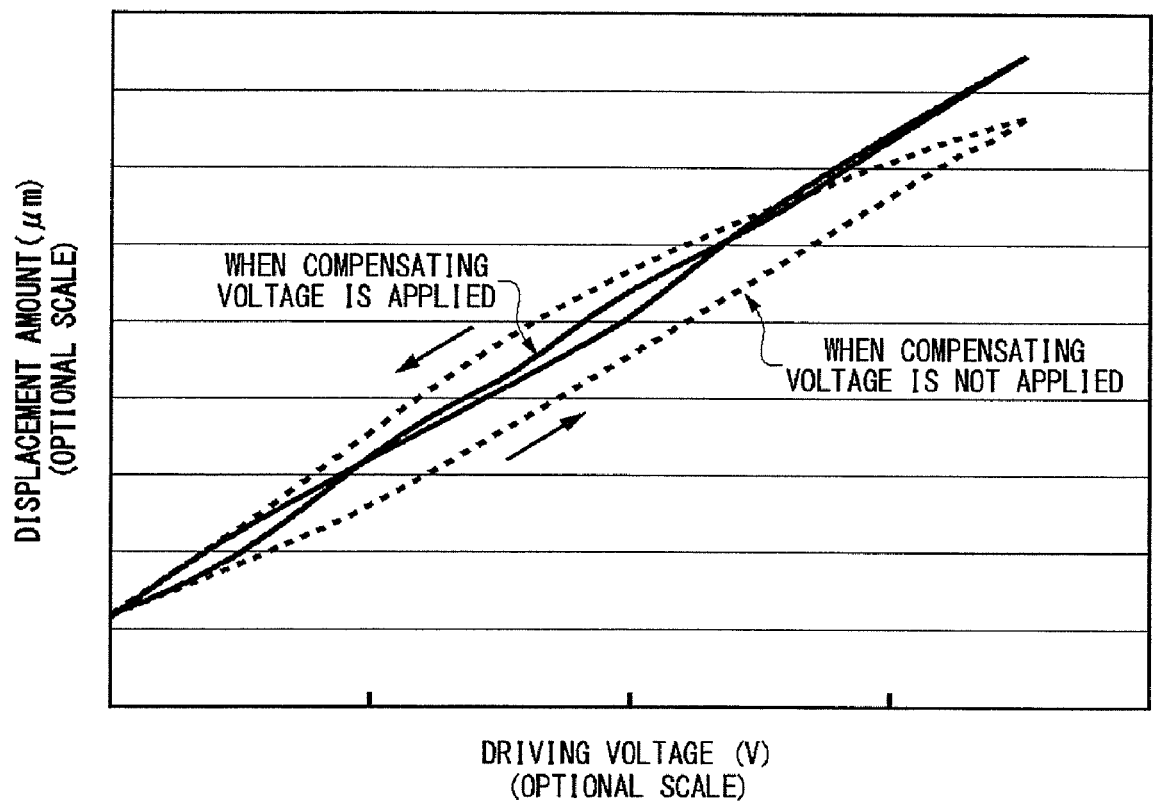
FIG. 4 is a view showing a displacement amount of a laminated body 110 in a height direction H to a driving voltage applied to the piezoelectric driving device 100.

FIG. 4 is a view showing the displacement amount of the laminated body 110 in the height direction H to the driving voltage applied to the piezoelectric driving device 100. In the present drawing, the horizontal axis shows a driving voltage applied to the first electrode 160, and the vertical axis shows the displacement amount of the laminated body 110 in the height direction H when the driving voltage is applied. In the present drawing, the dotted line shows the displacement amount of the laminated body 110 to the driving voltage when a compensating voltage is not applied. On the other hand, the solid line shows the displacement amount of the laminated body 110 to the driving voltage when a compensating voltage is applied on the basis of the piezoelectric drive controlling method shown in FIG. 3. In addition, in the present drawing, the vertical axis and the horizontal axis are shown with arbitrary scales.

When a compensating voltage is not applied as shown in FIG. 4, hysteresis occurs in the laminated body 110. In other words, when the driving voltage is increased, the displacement amount of the laminated body 110 is increased while a convex curved line is drawn downward. On the other hand, when the driving voltage is decreased, the displacement amount of the laminated body 110 is decreased while a convex curved line is drawn upward.

On the contrary, when the compensating voltage is applied, the driving voltage and the displacement amount of the laminated body 110 are in a substantially linear relation. In other words, in the present embodiment, a compensating voltage is applied so that the second piezoelectric body 140 assists the expansion and contraction of the first piezoelectric body 130 when the driving voltage is increased and a compensating voltage is applied so that the second piezoelectric body 140 restrains the expansion and contraction of the first piezoelectric body 130 when the driving voltage is decreased. According to the above-described configuration, even when the laminated body has hysteresis, the displacement amount of the laminated body 110 can be controlled with high precision in accordance with the driving voltage applied to the laminated body 110 without using a complicated feedback circuit.

Figure 5:
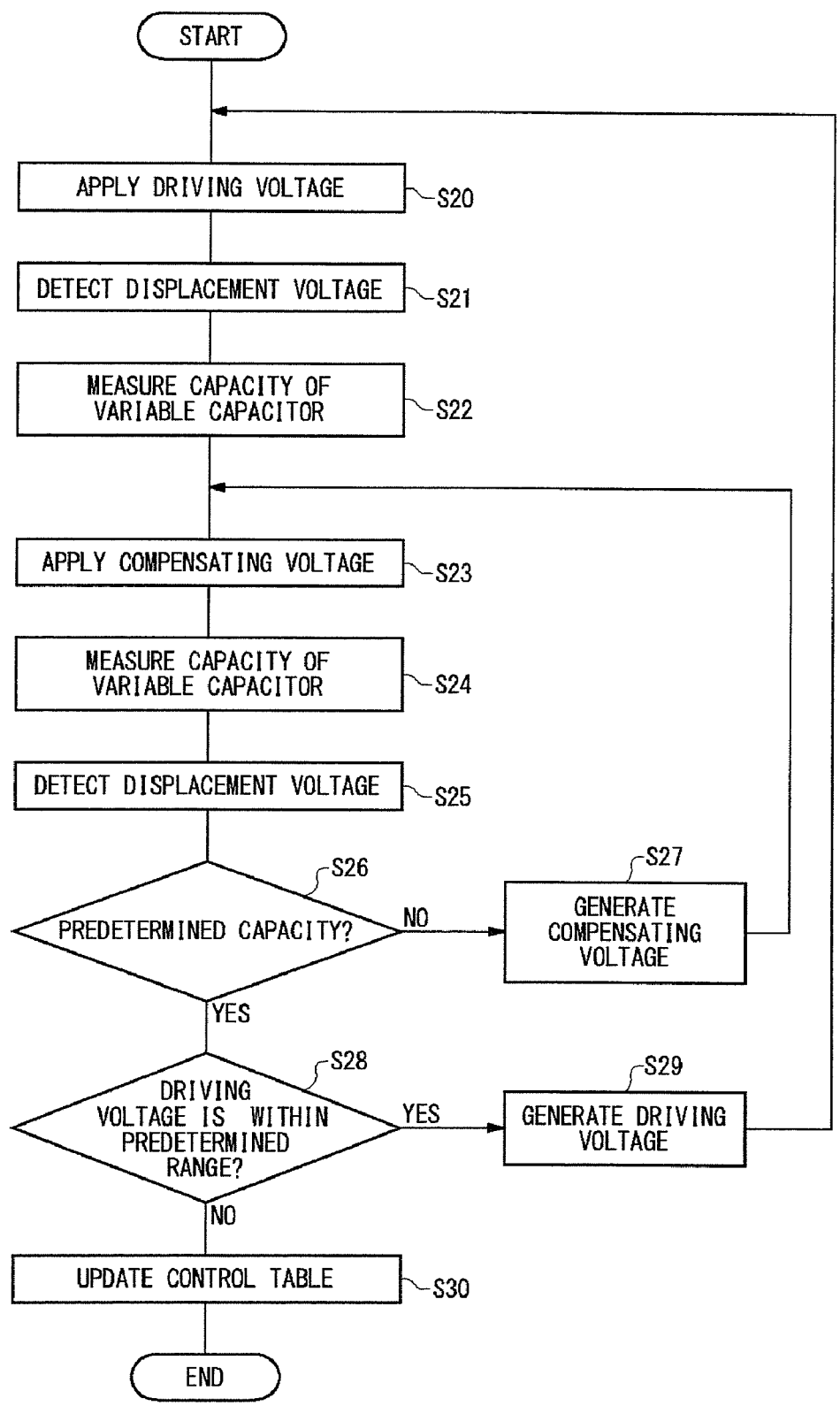
FIG. 5 is a flowchart exemplary showing a calibration method of the variable capacitor 10.

FIG. 5 is a flowchart exemplary showing a calibration method of the variable capacitor 10. The variable capacitor 10 can be calibrated so that a predetermined capacity thereof is formed for a driving voltage, by updating the values of the control table 196 in accordance with the procedure shown in the present drawing, for each of the case that the driving voltage is increased and the case that the driving voltage is decreased. Hereinafter, it will be described about the procedure of updating the values of the control table 196 when the driving voltage is increased. However, the values can be similarly updated when the driving voltage is decreased.

First, the piezoelectric driving device 100 applies a driving voltage (S20). The driving voltage is applied as follows.

A signal indicating the effect that the calibration of the variable capacitor 10 is started is inputted into the control section 192. The control section 192 outputs to the driving voltage generating section 180 a signal related to a driving voltage using a minimum voltage to be applied to the laminated body 110 as a driving voltage. The control section 192 stores this driving voltage. The driving voltage generating section 180 outputs to the voltage applying section 184 a signal indicating the effect that the driving voltage inputted from the control section 192 should be applied to the first electrode 160. The voltage applying section 184 applies a voltage generated from the first power supply 186 to the first electrode 160.

Next, the piezoelectric driving device 100 detects a displacement voltage (S21). The displacement voltage is detected as follows.

The sensing section 190 detects a displacement voltage between the first sensing electrode 164 and the second sensing electrode 168. The sensing section 190 outputs a signal related to this displacement voltage to the control section 192. The control section 192 stores therein this displacement voltage in association with the driving voltage applied in S20.

Next, the piezoelectric driving device 100 measures the capacity of the variable capacitor 10 (S22). At this time, the control section 192 acquires information related to the capacity of the variable capacitor 10.

Next, the piezoelectric driving device 100 applies a compensating voltage (S23). The compensating voltage is applied as follows.

The control section 192 refers to the current control table 196. The control section 192 outputs a signal related to a compensating voltage corresponding to the above displacement voltage to the compensating voltage generating section 182. The compensating voltage generating section 182 outputs to the voltage applying section 184 a signal indicating the effect that the compensating voltage inputted from the control section 192 should be applied to the second electrode 162. The voltage applying section 184 applies a voltage generated from the second power supply 188 to the second electrode 162.

Next, the piezoelectric driving device 100 measures the capacity of the variable capacitor 10 (S24). Then, the control section 192 acquires information related to the capacity of the variable capacitor 10. The sensing section 190 may output the detected displacement voltage to the control section 192 (S25).

Next, the control section 192 decides whether or not the capacity of the variable capacitor 10 acquired in S24 is a predetermined capacity determined for the driving voltage applied to the laminated body 110 in S20 (S26). When the capacity of the variable capacitor 10 acquired in S24 is not the predetermined capacity (S26: NO), a compensating voltage is generated (S27). The compensating voltage is generated as follows.

The control section 192 sets a compensating voltage in order to move the capacity of the variable capacitor 10 closer to the predetermined capacity. The control section 192 outputs a signal related to this compensating voltage to the compensating voltage generating section 182. The compensating voltage generating section 182 outputs to the voltage applying section 184 a signal indicating the effect that the compensating voltage inputted from the control section 192 should be applied to the second electrode 162.

In this case, the above compensating voltage may be set in accordance with the difference between the capacity of the variable capacitor 10 acquired in S24 and the predetermined capacity, or may be set in accordance with the difference between the displacement voltage inputted from the sensing section in S21 and the displacement voltage inputted from the sensing section in S25. For example, when the capacity of the variable capacitor 10 acquired in S24 is larger than the above predetermined capacity, the compensating voltage is set to make the displacement of the laminated body 110 larger. The processes S23 to S27 are repeated until the capacity of the variable capacitor 10 becomes a predetermined capacity.

When a predetermined capacity is obtained as the capacity of the variable capacitor 10 in S26 (S26: YES), the control section 192 stores a compensating voltage when the predetermined capacity is obtained in association with the driving voltage applied in S20. Next, the control section 192 increases a driving voltage to be applied to the laminated body 110 by a predetermined amount, then sets the driving voltage to be applied to the laminated body 110, and decides whether or not the driving voltage is smaller than the maximum voltage (S28).

When this driving voltage is smaller than the maximum voltage (S28: YES), a driving voltage is generated (S29). The driving voltage is generated as follows.

The control section 192 sets the driving voltage set in S28 as a driving voltage. The control section 192 outputs a signal related to this driving voltage to the driving voltage generating section 180. The driving voltage generating section 180 outputs to the voltage applying section 184 a signal indicating the effect that the driving voltage inputted from the control section 192 should be applied to the first electrode 160. The processes S20 to S29 are repeated until the above driving voltage becomes larger than the maximum voltage.

Next, the piezoelectric driving device 100 updates the control table 196 (S30). The control table 196 is updated as follows.

When the above driving voltage becomes larger than the maximum voltage in S28, the control table 196 is updated by means of the driving voltage applied in S20, the displacement voltage stored in S21, and the compensating voltage stored in S26. The updated control table 196 is stored in the storing section 194.

Figure 6:
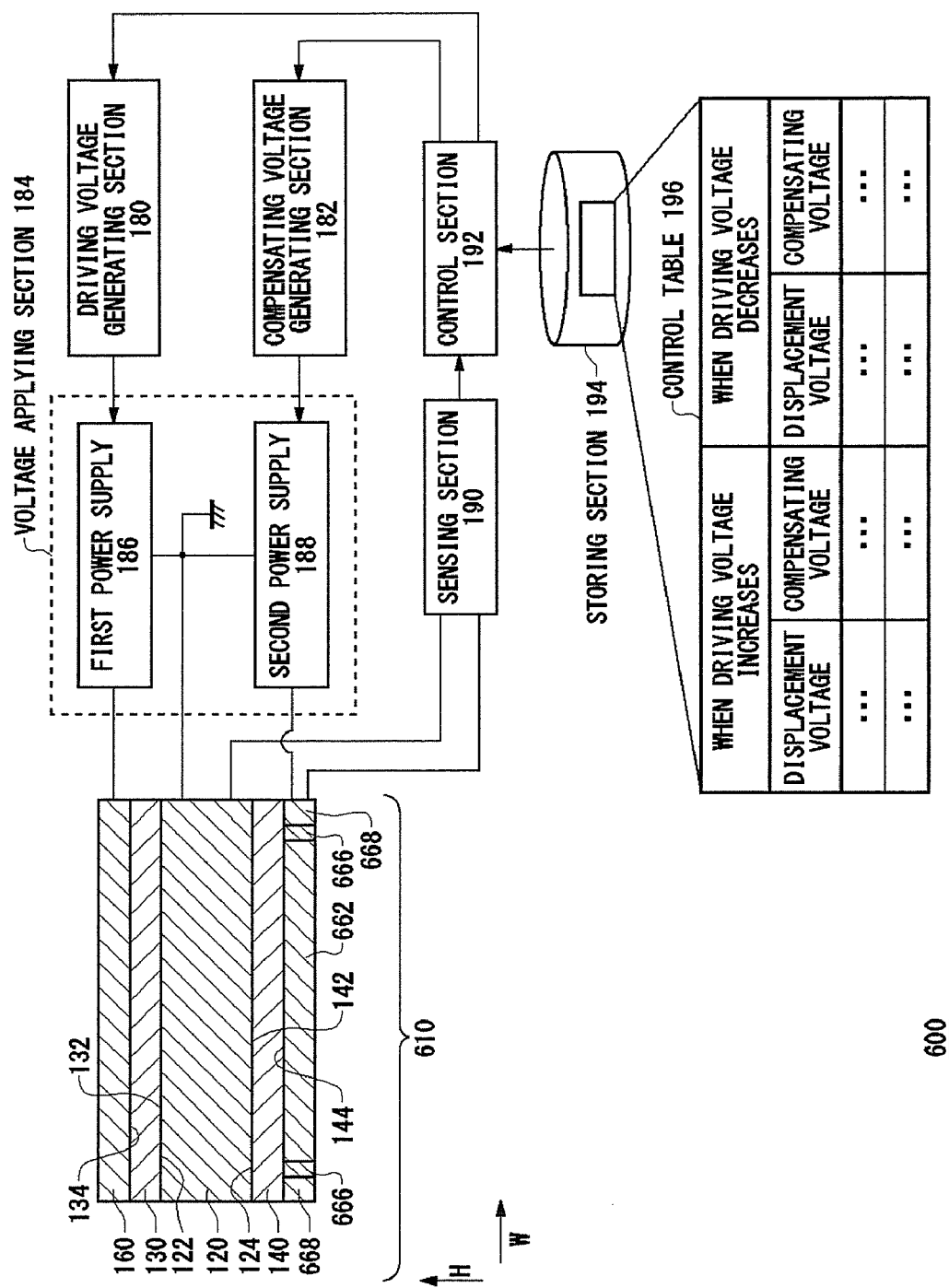
FIG. 6 is a view schematically showing a piezoelectric driving device 600 according to another embodiment.

FIG. 6 is a view schematically showing a piezoelectric driving device 600 according to another embodiment. As shown in FIG. 6, the piezoelectric driving device 600 differs from the piezoelectric driving device 100 in that the piezoelectric driving device 600 includes a laminated body 610 and the sensing section 190 detects a displacement voltage generated in the second piezoelectric body 140 by the displacement of the laminated body 610. In this way, since the laminated body 610 does not have the third piezoelectric body 150, the piezoelectric driving device can be easily manufactured and the laminated body can be displaced with smaller electric power. In regard to FIG. 6, the same components as those of FIG. 1 have the same reference numerals as those of FIG. 1 and thus the overlapped description is omitted.

FIG. 6 shows a sectional view when the laminated body 610 is cut in a width direction W. The piezoelectric driving device 600 detects a displacement voltage generated in the second piezoelectric body 140. The piezoelectric driving device 600 includes the laminated body 610. The laminated body 610 includes a second electrode 662, and an insulating layer 666, and a sensing electrode 668.

The second electrode 662 is formed on a face 144 opposite to a face 142 of the second piezoelectric body 140 facing the base 120. The second electrode 662 is elongated in a longitudinal direction L of the laminated body 610. The second electrode 662 may use an electrode material similar to that of the first electrode 160. The second electrode 662 is connected to the second power supply 188.

The insulating layer 666 is formed on the face 144 similarly to the second electrode 662. The insulating layer 666 electrically insulates the second electrode 662 from the sensing electrode 668. For example, the insulating layer 666 may use an insulating material such as silicon oxide ($SiO_2$).

The sensing electrode 668 is formed on the face 144 similarly to the second electrode 662. The sensing electrode 668 is connected to the sensing section 190. The second electrode 662 and the sensing electrode 668 are electrically insulated by the insulating layer 666.

The sensing section 190 is supplied with potential information from the base 120 and the sensing electrode 668. The sensing section 190 detects the potential difference as a displacement voltage generated in the second piezoelectric body 140. The sensing section 190 outputs a signal related to the displacement voltage to the control section 192. When disposing the displacement electrode 102 in the piezoelectric driving device 600, the displacement electrode 102 is disposed to be electrically insulated from an appropriate portion of the laminated body 610.

Figure 7:
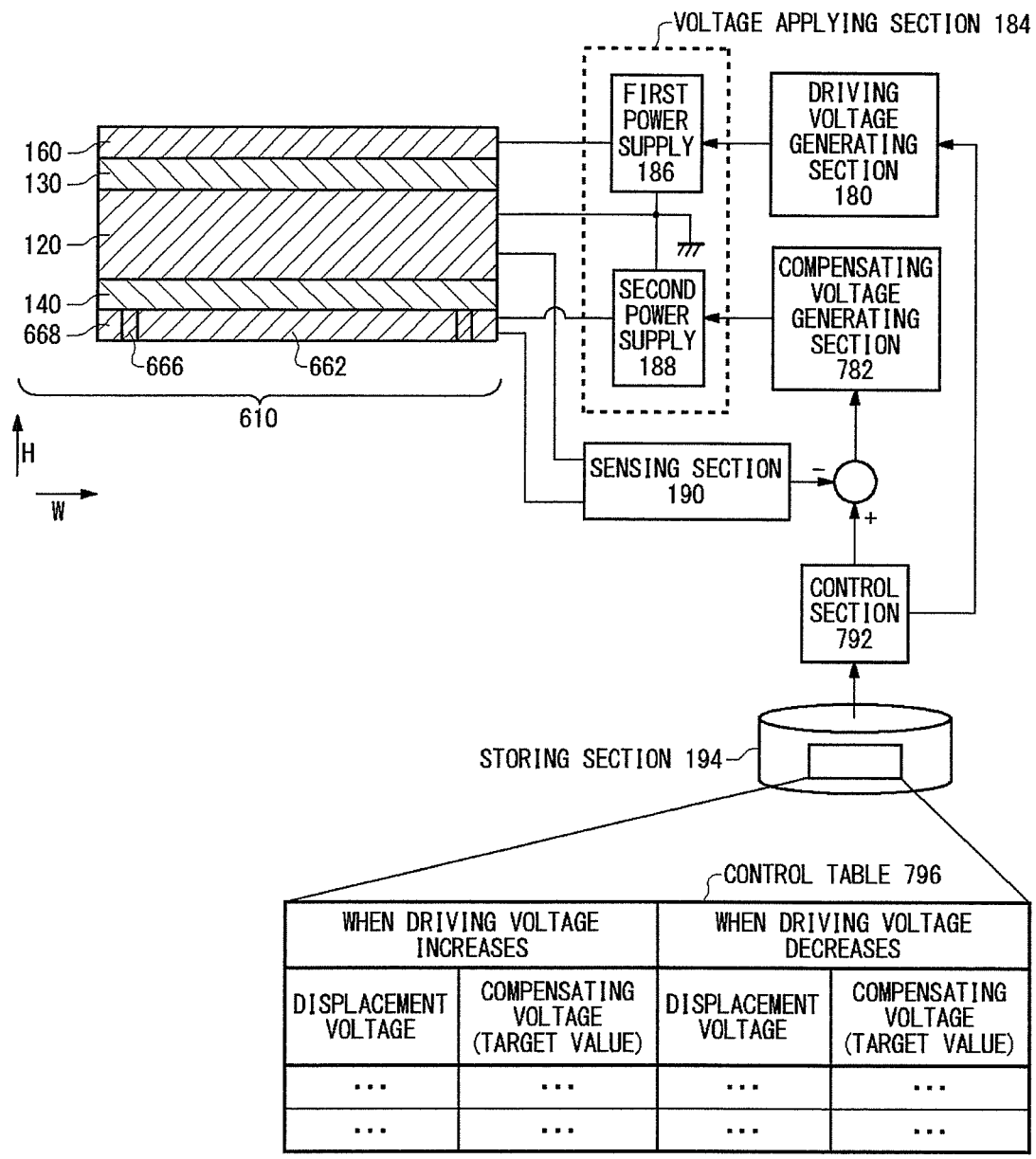
FIG. 7 is a view schematically showing a piezoelectric driving device 700 according to further another embodiment.

FIG. 7 is a view schematically showing a piezoelectric driving device 700 according to further another embodiment. As shown in FIG. 7, the piezoelectric driving device 700 differs from the piezoelectric driving device 600 in that the sensing section 190 feeds back the detected displacement voltage to the compensating voltage generating section 782 and the compensating voltage generating section 782 generates a compensating voltage. By the above configuration, since the target value of a displacement voltage is previously determined, the piezoelectric driving device 700 dose not have a complicated feedback circuit even if the device adopts a feedback control. In regard to FIG. 7, the same components as those of FIG. 1 have the same reference numerals as those of FIG. 1 and thus the overlapped description is omitted.

As shown in FIG. 7, the piezoelectric driving device 700 has a control section 792. The piezoelectric driving device 700 stores a control table 796 in the storing section 194. The control table 796 defines a driving voltage and a target value of a displacement voltage corresponding to the driving voltage, for each of the case that the driving voltage is increased and the case that the driving voltage is decreased.

The control section 792 sets the target value of the displacement voltage on the basis of information related to the increase and decrease of the driving voltage, the driving voltage, and the control table 796. The control section 792 outputs a signal related to the target value to the compensating voltage generating section 782. The compensating voltage generating section 782 outputs to the voltage applying section 184 a signal indicating the effect that the compensating voltage by which a displacement voltage inputted from the sensing section 190 approximates a target value should be applied to the second electrode 162, on the basis of the target value of the displacement voltage inputted from the sensing section 190 and the displacement voltage inputted from the control section 792.

Figure 8:
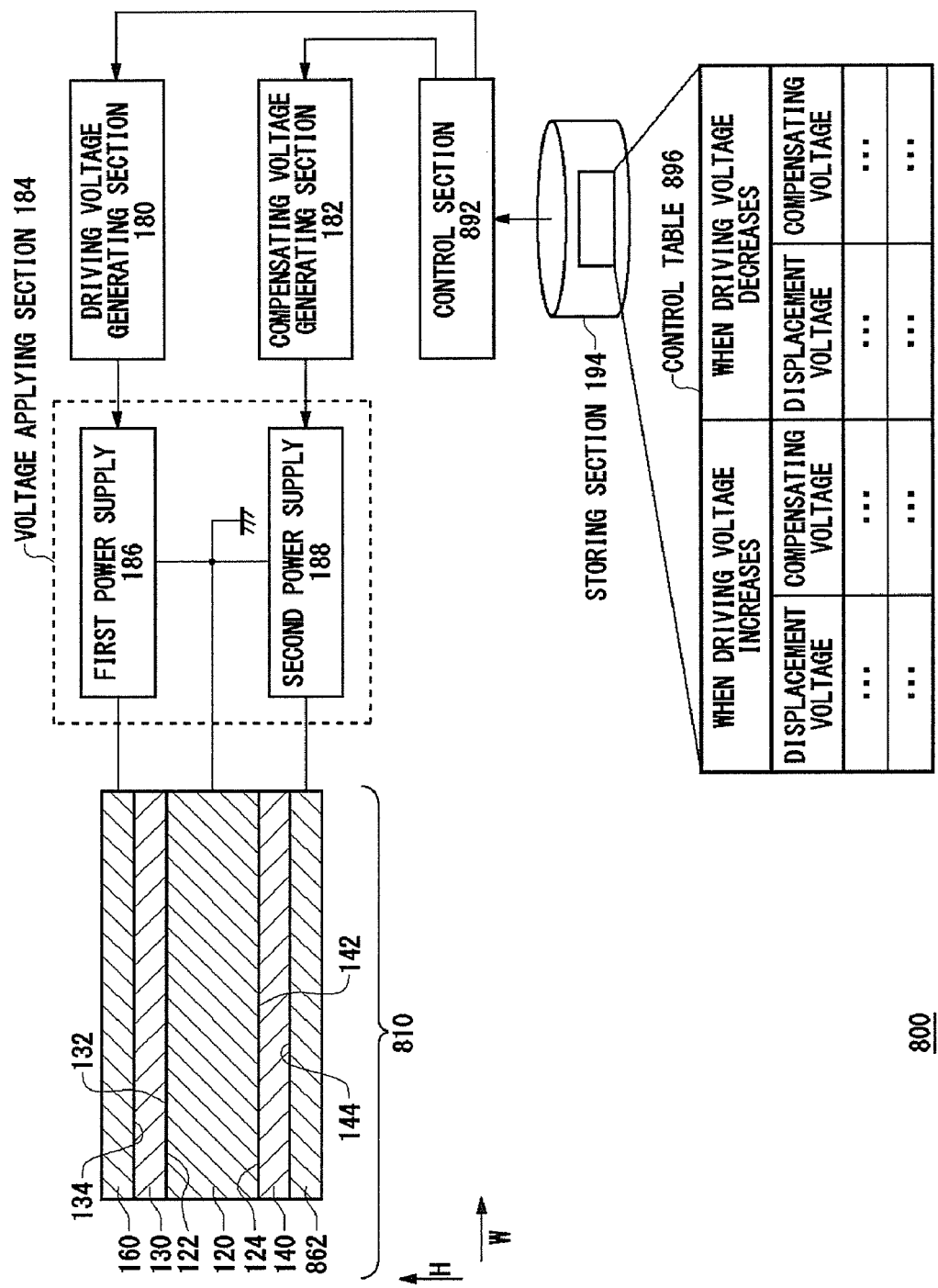
FIG. 8 is a view schematically showing a piezoelectric driving device 800 according to still further another embodiment.

FIG. 8 is a view schematically showing a piezoelectric driving device 800 according to still further another embodiment. As shown in FIG. 8, the piezoelectric driving device 800 differs from the piezoelectric driving device 600 in that the piezoelectric driving device 800 includes a laminated body 810 and applies a compensating voltage without the use of the sensing section 190. In this way, the configuration of the piezoelectric driving device is further simplified. In regard to FIG. 8, the same components as those of FIG. 1 have the same reference numerals as those of FIG. 1 and thus the overlapped description is omitted.

FIG. 8 shows a sectional view when the laminated body 810 is cut in a width direction W. The laminated body 810 includes a second electrode 862. The second electrode 862 is disposed on the face 144 opposite to the face 142 facing the base 120 of the second piezoelectric body 140. The second electrode 862 may use an electrode material similar to that of the first electrode 160. The second electrode 862 is connected to the second power supply 188.

As shown in FIG. 8, the piezoelectric driving device 800 has a control section 892. The piezoelectric driving device 800 stores a control table 896 in the storing section 194.

The control table 896 defines a driving voltage and a compensating voltage corresponding to the driving voltage, for each of the case that the driving voltage is increased and the case that the driving voltage is decreased. The control table 896 is obtained by previously measuring the displacement amount of the laminated body 810 for each driving voltage to obtain the measurement value of the displacement amount and previously measuring the compensating voltage by which the measurement value of the displacement amount can be linear for the driving voltage.

The control section 892 sets the displacement amount of the laminated body 810. The control section 892 outputs a signal related to the driving voltage according to the displacement amount to the driving voltage generating section 180. The control section 892 obtains a compensating voltage according to the driving voltage on the basis of the driving voltage, information related to the increase and decrease of the driving voltage, and the control table 896. The control section 892 outputs a signal related to the compensating voltage to the compensating voltage generating section 182. The compensating voltage generating section 182 outputs to the voltage applying section 184 a signal indicating the effect that the compensating voltage inputted from the control section 892 should be applied to the second electrode 862.

Figure 9:
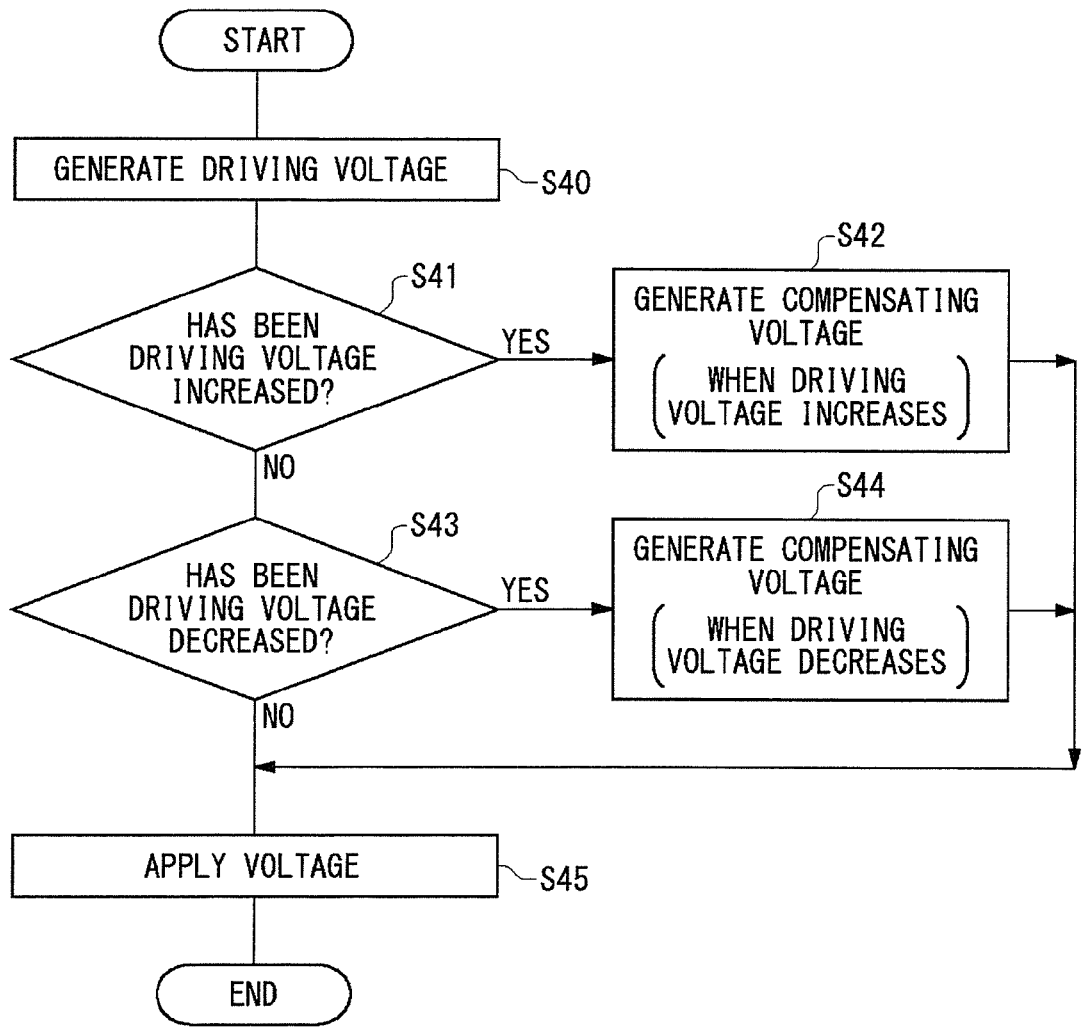
FIG. 9 is a flowchart exemplary showing a piezoelectric drive controlling method of the piezoelectric driving device 800 having a laminated body 810 prepared as above.

FIG. 9 is a flowchart exemplary showing a piezoelectric drive controlling method of the piezoelectric driving device 800 having the laminated body 810 prepared as above. Hereinafter, it will be described about the case that the capacity of the variable capacitor 10 is adjusted to a predetermined capacity.

First, the piezoelectric driving device 800 generates a driving voltage (S40). The driving voltage is generated as follows.

The control section 892 stores the driving voltage that is now being applied to the first electrode 160. The control section 892 obtains a driving voltage to be applied to the first electrode 160 from the displacement amount of the laminated body 810 forming a capacity after adjustment of the variable capacitor 10. The control section 892 outputs the driving voltage to the driving voltage generating section 180. The driving voltage generating section 180 outputs to the voltage applying section 184 a signal indicating the effect that the driving voltage inputted from the control section 892 should be applied to the first electrode 160.

Next, the control section 892 determines whether or not the driving voltage has been increased in S40 (S41). When the driving voltage has been increased in S40 (S41: YES), the piezoelectric driving device 800 generates a compensating voltage when the driving voltage is increased (S42). The compensating voltage is generated as follows.

The control section 892 obtains a compensating voltage to be applied to the second electrode 162 with reference to a compensating voltage corresponding to the driving voltage when the driving voltage is increased, which is stored in the control table 896. The control section 892 outputs a signal related to the compensating voltage to the compensating voltage generating section 182. The compensating voltage generating section 182 outputs to the voltage applying section 184 a signal indicating the effect that the compensating voltage inputted from the control section 892 should be applied to the second electrode 862.

When the driving voltage has not been increased in S40 (S41: NO), the control section 892 determines whether or not the driving voltage has been decreased in S40 (S43). When the driving voltage has been decreased in S40 (S43: YES), the piezoelectric driving device 800 generates a compensating voltage when the driving voltage is decreased (S44). The compensating voltage is generated as follows.

The control section 892 obtains a compensating voltage to be applied to the second electrode 162 with reference to a compensating voltage corresponding to the driving voltage when the driving voltage is decreased, which is stored in the control table 896. The control section 892 outputs the compensating voltage to the compensating voltage generating section 182. The compensating voltage generating section 182 outputs to the voltage applying section 184 a signal indicating the effect that the compensating voltage inputted from the control section 892 should be applied to the second electrode 862.

Next, the piezoelectric driving device 800 applies a voltage (S45). The voltage is applied as follows. The voltage applying section 184 applies a voltage generated from the first power supply 186 to the first electrode 160. The voltage applying section 184 applies a voltage generated from the second power supply 188 to the second electrode 162 (S45). In this way, although a laminated body having a simple structure is utilized, the displacement amount of the laminated body can be quickly be controlled with high precision.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

The claims, specification and drawings describe the processes of an apparatus, a system, a program and a method by using the terms such as operations, procedures, steps and stages. When a reference is made to the execution order of the processes, wording such as "before" or "prior to" is not explicitly used. The processes may be performed in any order unless an output of a particular process is used by the following process. In the claims, specification and drawings, a flow of operations may be explained by using the terms such as "first" and "next" for the sake of convenience. This, however, does not necessarily indicate that the operations should be performed in the explained order.

What is claimed is:

1. A piezoelectric driving device comprising:
a laminated body comprising a base that is capable of being deformed by applying force, a first piezoelectric body that is formed on a first face of the base directly or via another layer, and a second piezoelectric body that is formed on a second face of the base substantially parallel to the first face, directly or via another layer;
a driving voltage generating section that generates a driving voltage to displace the laminated body by a displacement amount;
a compensating voltage generating section that generates a compensating voltage compensating for hysteresis caused by the displacement of the laminated body by the driving voltage so that the displacement amount of the laminated body becomes linear, wherein the compensating voltage generating section generates the compensating voltage according to the driving voltage on the basis of a measurement value obtained by previously measuring, for the driving voltage, i) a displacement voltage generated in the second piezoelectric body by the displacement of the laminated body or ii) the displacement amount of the laminated body, for each of the case that the driving voltage represents an increase in voltage and the case that the driving voltage represents a decrease in voltage; and
a voltage applying section that applies each of the driving voltage and the compensating voltage to each of the first piezoelectric body and the second piezoelectric body.

2. The piezoelectric driving device according to claim 1, wherein
the laminated body further comprises a third piezoelectric body that is formed, either directly or via another layer, on the first face of the base, the second face of the base, a face opposite to a face of the first piezoelectric body facing the base, or a face opposite to a face of the second piezoelectric body facing the base,
the piezoelectric driving device further comprises a sensing section that detects a displacement voltage generated in the third piezoelectric body by the displacement of the laminated body, and
the compensating voltage generating section generates the compensating voltage on the basis of the displacement voltage detected by the sensing section.

3. The piezoelectric driving device according to claim 1, wherein the compensating voltage generating section applies a modulation voltage to be superposed on the compensating voltage.

4. A piezoelectric drive controlling method comprising:
preparing a laminated body having a base that is capable of being deformed by applying force, a first piezoelectric body that is formed on a first face of the base directly or via another layer, and a second piezoelectric body that is formed on a second face of the base substantially parallel to the first face directly or via another layer;
generating a driving voltage to displace the laminated body by a displacement amount;
generating a compensating voltage compensating for hysteresis caused by displacement of the laminated body by the driving voltage so that the displacement amount of the laminated body becomes linear, wherein the compensating voltage generating includes generating the compensating voltage according to the driving voltage on the basis of a measurement value obtained by previously measuring, for the driving voltage, i) a displacement voltage generated in the second piezoelectric body by the displacement of the laminated body or ii) the displacement amount of the laminated body, for each of the case that the driving voltage represents an increase in voltage and the case that the driving voltage represents a decrease in voltage; and
applying each of the driving voltage and the compensating voltage to each of the first piezoelectric body and the second piezoelectric body.

5. The piezoelectric drive controlling method according to claim 4, wherein
the laminated body preparing includes preparing the laminated body further having a third piezoelectric body that is formed, either directly or via another layer, on the first face of the base, the second face of the base, a face opposite to a face of the first piezoelectric body facing the base, or a face opposite to a face of the second piezoelectric body facing the base,
the piezoelectric drive controlling method further comprises detecting a displacement voltage generated in the third piezoelectric body in accordance with the displacement of the laminated body, and
the compensating voltage generating includes generating the compensating voltage on the basis of the detected displacement voltage.

6. The piezoelectric drive controlling method according to claim 4, wherein the compensating voltage generating includes applying a modulation voltage to be superposed on the compensating voltage.

7. An electronic device comprising:
a piezoelectric driving device including:
a laminated body having a base that is capable of being deformed by applying force, a first piezoelectric body that is formed on a first face of the base directly or via another layer, and a second piezoelectric body that is formed on a second face of the base substantially parallel to the first face directly or via another layer,
a driving voltage generating section that generates a driving voltage to displace the laminated body by a displacement amount,
a compensating voltage generating section that generates a compensating voltage compensating for hysteresis caused by displacement of the laminated body by the driving voltage so that the displacement amount of the laminated body becomes linear, wherein the compensating voltage generating section generates the compensating voltage according to the driving voltage on the basis of a measurement value obtained by previously measuring, for the driving voltage, i) a displacement voltage generated in the second piezoelectric body by the displacement of the laminated body or ii) the displacement amount of the laminated body, for each of the case that the driving voltage represents an increase in voltage and the case that the driving voltage represents a decrease in voltage, and
a voltage applying section that applies each of the driving voltage and the compensating voltage to each of the first piezoelectric body and the second piezoelectric body;
a displacement electrode that is disposed on a displacement section of the piezoelectric driving device; and
a fixed electrode that forms a variable capacity along with the displacement electrode.

8. The electronic device according to claim 7, wherein
the laminated body further comprises a third piezoelectric body that is formed, either directly or via another layer, on the first face of the base, the second face of the base, a face opposite to a face of the first piezoelectric body facing the base, or a face opposite to a face of the second piezoelectric body facing the base,
the electronic device further comprises a sensing section that detects a displacement voltage generated in the third piezoelectric body by the displacement of the laminated body, and
the compensating voltage generating section generates the compensating voltage on the basis of the displacement voltage detected by the sensing section.

9. The electronic device according to claim 7, wherein the compensating voltage generating section applies a modulation voltage to be superposed on the compensating voltage.

10. A piezoelectric driving device comprising:
a laminated body comprising a base that is capable of being deformed by applying force, a first piezoelectric body that is formed on a first face of the base directly or via another layer, a second piezoelectric body that is formed on a second face of the base substantially parallel to the first face, directly or via another layer, and a third piezoelectric body that is formed, either directly or via another layer, on the first face of the base, the second face of the base, a face opposite to a face of the first piezoelectric body facing the base, or a face opposite to a face of the second piezoelectric body facing the base;
a sensing section that detects a displacement voltage generated in the third piezoelectric body by the displacement of the laminated body;
a first sensing electrode and a second sensing electrode that are electrically insulated from each other and connected to the sensing section;
a driving voltage generating section that generates a driving voltage according to a displacement amount of the laminated body;
a compensating voltage generating section that generates a compensating voltage compensating for hysteresis caused by the displacement of the laminated body by the driving voltage on the basis of the displacement voltage detected by the sensing section so that the displacement amount of the laminated body becomes linear; and
a voltage applying section that applies each of the driving voltage and the compensating voltage to each of the first piezoelectric body and the second piezoelectric body.

11. The piezoelectric driving device according to claim 10, wherein the compensating voltage generating section generates the compensating voltage according to the driving voltage on the basis of a measurement value obtained by previously measuring the displacement amount of the laminated body for the driving voltage, for each of the case that the driving voltage is increased and the case that the driving voltage is decreased.

12. The piezoelectric driving device according to claim 10, further comprising a sensing section that detects a displacement voltage generated in the second piezoelectric body by the displacement of the laminated body, wherein
the compensating voltage generating section generates the compensating voltage on the basis of the displacement voltage detected by the sensing section.

13. The piezoelectric driving device according to claim 12, wherein the compensating voltage generating section generates the compensating voltage according to the driving voltage on the basis of a measurement value obtained by previously measuring the displacement voltage for the driving voltage, for each of the case that the driving voltage is increased and the case that the driving voltage is decreased.

14. The piezoelectric driving device according to claim 10, wherein the compensating voltage generating section applies a modulation voltage to be superposed on the compensating voltage.

15. A piezoelectric drive controlling method comprising:
preparing a laminated body having a base that is capable of being deformed by applying force, a first piezoelectric body that is formed on a first face of the base directly or via another layer, a second piezoelectric body that is formed on a second face of the base substantially parallel to the first face directly or via another layer, and a third piezoelectric body that is formed, either directly or via another layer, on the first face of the base, the second face of the base, a face opposite to a face of the first piezoelectric body facing the base, or a face opposite to a face of the second piezoelectric body facing the base;
providing a first sensing electrode and a second sensing electrode that are electrically insulated from each other;
receiving signals from the first sensing electrode and the second sensing electrode and detecting a displacement voltage generated in the third piezoelectric body in accordance with the displacement of the laminated body;
generating a driving voltage according to a displacement amount of the laminated body;
generating a compensating voltage compensating for hysteresis caused by displacement of the laminated body by the driving voltage on the basis of the detected displacement voltage so that the displacement amount of the laminated body becomes linear; and
applying each of the driving voltage and the compensating voltage to each of the first piezoelectric body and the second piezoelectric body.

16. The piezoelectric drive controlling method according to claim 15, wherein the compensating voltage generating includes generating the compensating voltage according to the driving voltage on the basis of a measurement value obtained by previously measuring the displacement amount of the laminated body for the driving voltage, for each of the case that the driving voltage is increased and the case that the driving voltage is decreased.

17. The piezoelectric drive controlling method according to claim 15, further comprising detecting a displacement voltage generated in the second piezoelectric body in accordance with the displacement of the laminated body, wherein
the compensating voltage generating includes generating the compensating voltage on the basis of the detected displacement voltage.

18. The piezoelectric drive controlling method according to claim 17, wherein the compensating voltage generating includes generating the compensating voltage according to the driving voltage on the basis of a measurement value obtained by previously measuring the displacement voltage for the driving voltage, for each of the case that the driving voltage is increased and the case that the driving voltage is decreased.

19. The piezoelectric drive controlling method according to claim 15, wherein the compensating voltage generating includes applying a modulation voltage to be superposed on the compensating voltage.

20. An electronic device comprising:
a piezoelectric driving device including:
a laminated body having a base that is capable of being deformed by applying force, a first piezoelectric body that is formed on a first face of the base directly or via another layer, a second piezoelectric body that is formed on a second face of the base substantially parallel to the first face directly or via another layer, and a third piezoelectric body that is formed, either directly or via another layer, on the first face of the base, the second face of the base, a face opposite to a face of the first piezoelectric body facing the base, or a face opposite to a face of the second piezoelectric body facing the base,
a sensing section that detects a displacement voltage generated in the third piezoelectric body by the displacement of the laminated body,
a first sensing electrode and a second sensing electrode that are electrically insulated from each other and connected to the sensing section,
a driving voltage generating section that generates a driving voltage according to a displacement amount of the laminated body,
a compensating voltage generating section that generates a compensating voltage compensating for hysteresis caused by displacement of the laminated body by the driving voltage on the basis of the displacement voltage detected by the sensing section so that the displacement amount of the laminated body becomes linear,
a voltage applying section that applies each of the driving voltage and the compensating voltage to each of the first piezoelectric body and the second piezoelectric body on the basis of the displacement voltage detected by the sensing section,
a displacement electrode that is disposed on a displacement section of the piezoelectric driving device; and
a fixed electrode that forms a variable capacity along with the displacement electrode.

21. The electronic device according to claim 20, wherein the compensating voltage generating section generates the compensating voltage according to the driving voltage on the basis of a measurement value obtained by previously measuring the displacement amount of the laminated body for the driving voltage, for each of the case that the driving voltage is increased and the case that the driving voltage is decreased.

22. The electronic device according to claim 20, further comprising a sensing section that detects a displacement voltage generated in the second piezoelectric body by the displacement of the laminated body, wherein
the compensating voltage generating section generates the compensating voltage on the basis of the displacement voltage detected by the sensing section.

23. The electronic device according to claim 22, wherein the compensating voltage generating section generates the compensating voltage according to the driving voltage on the basis of a measurement value obtained by previously measuring the displacement voltage for the driving voltage, for each of the case that the driving voltage is increased and the case that the driving voltage is decreased.

24. The electronic device according to claim 20, wherein the compensating voltage generating section applies a modulation voltage to be superposed on the compensating voltage.

* * * * *